United States Patent [19]

Fujino et al.

[11] Patent Number: 5,266,424
[45] Date of Patent: Nov. 30, 1993

[54] METHOD OF FORMING PATTERN AND METHOD OF MANUFACTURING PHOTOMASK USING SUCH METHOD

[75] Inventors: Takeshi Fujino; Yaichiro Watakabe, both of Hyogo, Japan

[73] Assignee: Mitsubishi Denki Kabushiki Kaisha, Tokyo, Japan

[21] Appl. No.: 849,602

[22] Filed: Mar. 12, 1992

[30] Foreign Application Priority Data

Mar. 15, 1991 [JP] Japan .................................. 3-051674

[51] Int. Cl.$^5$ ............................................. G03F 9/00
[52] U.S. Cl. ....................................... 430/5; 430/270; 430/296; 430/329; 430/330
[58] Field of Search ................... 430/5, 270, 296, 329, 430/330

[56] References Cited

U.S. PATENT DOCUMENTS

| | | | |
|---|---|---|---|
| 4,837,124 | 6/1989 | Wu et al. | 430/326 |
| 4,863,827 | 9/1989 | Jain et al. | 430/326 |
| 4,978,594 | 12/1990 | Bruce et al. | 430/325 |

OTHER PUBLICATIONS

"Silylated Acid Hardened Resist [SAHR] Technology: Positive, Dry Developable Deep UV Resists", SPIE Dry Process Symposium, James W. Thackeray, et al., pp. 1-15, 1989.
"Silylation and Dry Development of Three Component Resists for Half-Micron Lithography", SPIE Advances in Resists Technology and Processing, Thierry G. Vachette, et al., pp. 1-15, Mar. 1990.
"Positive Resist Image by Dry Etching: New Dry Developed Positive Working System for Electron Beam and Deep Ultraviolet Lithography", J. Vac. Sci. Technol, vol. B7(6), pp. 1782-1786, Nov./Dec. 1989.
"Desire" (Diffusion Enhanced Silylating Resist), Technical Report, pp. 48-50, 1988.

Primary Examiner—Marion E. McCamish
Assistant Examiner—Mark A. Chapman
Attorney, Agent, or Firm—Lowe, Price, LeBlanc & Becker

[57] ABSTRACT

The present invention is mainly directed to provision of a method of producing a highly precise resist pattern, even when a high energy beam is used. Resist containing a base resin including a hydroxyl group, an acid generating agent irradiated with radiation for generating sulfonic acid, and a cross linking agent reacting with the hydroxyl group of the base resin by the catalytic action of the proton of the sulfonic acid thereby cross linking said base resin is applied onto a substrate. The resist is irradiated selectively with radiation, whereby the resist is divided into the exposed part and the non exposed part and the sulfonic acid is generated in the resist of the exposed part. The resist is heated to a first temperature so as to cross link the irradiated part of the resist. The resist is heated to a second temperature and exposed in an atmosphere of a silylating agent, and the surface of the exposed part of the resist is silylated. The resist is dry-developed with oxygen plasma.

19 Claims, 9 Drawing Sheets

R : ALKYL GROUP (C1~C4)

R1 : ALKYL GROUP (C1~C4)
R2 : H or CH3

R : ALKYL GROUP (C1~C4)

FIG. 9(g) ASHING

R : ALKYL GROUP (C1~C4)

R : ALKYL GROUP (C1~C4)

METHOD OF FORMING PATTERN AND METHOD OF MANUFACTURING PHOTOMASK USING SUCH METHOD

BACKGROUND OF THE INVENTION

1. Field of the Invention

The present invention relates generally to methods of forming resist patterns, and more specifically, to an improved method of forming resist patterns which allows formation of highly sensitive and good patterns using ultraviolet ray of a short wave length, or high energy beams such as electron beam and X ray. The present invention further relates to a method of manufacturing photomasks using such a method.

2. Description of the Background Art

DESIRE (Diffusion Enhanced Silylating Resist) process is dry development resist process presented by Coopman and Roland in 1986. FIGS. 10(a)–(e) illustrate the process flow of DESIRE process.

Referring to FIG. 10(a), a film 2 is formed on a substrate 1. A dry development resist 3 is formed on film 2. Dry development resist 3 is, for example, a PLASMASK ® resist manufactured by JAPAN SYNTHETIC RUBBER Co. Ltd. The composition of PLASMASK ® is not known in detail, but the resist contains novolac resin shown in FIG. 11(a) and quinondiazide shown in FIG. 11(b) form the principle constituents.

Referring back to FIG. 10(a), using a mask 4, resist 3 is selectively irradiated with ultraviolet light 5 of a wavelength 248–436 nm. Referring to FIG. 10(b), the selective irradiation of the ultraviolet light 5 divides resist 3 into the exposed part 3a and the non-exposed part 3b. At the exposed part 3a, quinondiazide decomposes in accordance with the reaction equation shown in FIG. 13.

Referring to FIG. 10(c), while heating substrate 1 to 120°–200° C., the mixed gas of a hexamethyldisilazane (HMDS) gas and a nitrogen gas is blown onto substrate 1. This treatment is called silylating process. The mixed gas of the HMDS gas and nitrogen gas is produced by bubbling nitrogen into liquid HMDS.

This silylating process causes HMDS to selectively diffuse into the exposed part 3a and react with the novolac resin in resist 3, thus forming a silylated layer 3c. Silylated layer 3c contains silylating compounds as shown in FIG. 12.

The selectability is provided for the following reason. At the exposed part 3a of resist 3, the quinondiazide decomposes into an indene carboxylic acid derivative. By the effect of the indene carboxylic acid, HMDS tends to diffuse to the side of the exposed part 3a rather than the non-exposed part 3b in which quinondiazide remains intact.

Referring to FIG. 10(d), with substrate 1 being exposed to $O_2$ plasma, silylated layer 3c turns into silicon oxide ($SiO_2$) 6. The silicon oxide 6 is highly resistant to $O_2$ plasma, and, therefore, etching does not proceed immediately under the part in which the silicon oxide 6 is formed. Meanwhile as shown in FIG. 10(a), etching does proceed in the part in which HMDS has not diffused. This is because the resist in this part consists of only the materials such as C, H, N and O which evaporate by oxidation.

This selective etching leaves a pattern only in the exposed part and a resist pattern of negative type is formed.

As described above, quinondiazide in the resist should be turned into carboxylic acid during exposure in the conventional DESIRE process using the PLASMASK as a resist.

In order to manufacture finer patterns, light of a shorter wavelength (a wavelength not more than 250 nm), or high energy beam such as electron beam and X ray should be used.

However, using high energy beam such as these, the reaction shown in FIG. 13 in which quinondiazide in the resist changes into carboxylic acid does not proceed efficiently. Also with the use of such high energy beam, side reaction such as cross linking of novolac resin takes place, impeding pattern formation. Also, the sensitivity is extremely low in this case.

SUMMARY OF THE INVENTION

It is therefore an object of the present invention to improve conventional DESIRE process.

Another object of the present invention is to provide a method of forming a resist pattern which allows the use of light of a short wavelength or high energy beam such as electron beam and X ray.

A further object of the present invention is to provide a method of producing a highly sensitive resist pattern even with the use of high energy beam.

Yet another object of the present invention is to provide a method of producing highly precise pattern formation even with the use of high energy beams.

A still further object of the present invention is to provide a method of manufacturing a photomask having a good image.

In order to achieve these objects, in a method of forming a resist pattern in accordance with the present invention, first a resist containing base resin including a hydroxyl group, an acid generating agent which generates sulfonic acid upon radiation irradiation, and a cross linking agent which reacts with the hydroxyl group of the base resin by the catalytic action of the proton of the sulfonic acid and cross links the base resin is applied onto the substrate. Radiation is selectively irradiated upon the resist, whereby the resist is divided into the exposed part and the non-exposed part, and sulfonic acid is generated in the resist at the exposed part. In the presence of the proton of the sulfonic acid as a catalyst, the resist is heated to a first temperature so that the hydroxyl group of the base resin reacts with the cross linking agent thereby cross linking the base resin at the exposed part. The resist is heated to a second temperature and exposed in an atmosphere of a silylating agent, thus silylating the surface of the non-exposed part of the resist. The resist is dry-developed by oxygen plasma.

According to a preferred embodiment of the present invention, triphenyl sulfonium triflate is used for the above-stated acid generating agent.

Also, hexamethylol-melamine-hexamethylether is preferably used for the above-stated cross linking agent.

The above-stated second temperature is preferably lower than the first temperature.

In a method of manufacturing a photomask in accordance with another aspect of the present invention, a metal layer is formed on a glass substrate. Resist is applied on the metal layer, which contains base resin containing a hydroxyl group, an acid generating agent which generates sulfonic acid by the irradiation, and a cross linking agent which reacts with the hydroxyl group of the base resin by the catalytic action of the proton of the sulfonic acid and cross links the base resin. Radiation is selectively irradiated upon the resist, whereby the resist is divided into the exposed part and the non-exposed part, and the sulfonic acid is generated in the resist at the exposed part. The resist is heated to a first temperature so that the hydroxyl group of the base resin reacts with the cross linking agent in the presence of the proton of the sulfonic acid as the catalyst and the exposed part of the base resin is cross linked. The surface of the non-exposed part of the resist is selectively silylated by heating the resist to a second temperature and exposing the same in an atmosphere of a silylating agent. The resist is dry-developed by oxygen plasma, thereby forming a positive type resist pattern exclusive of the exposed part. The metal layer is selectively etched, using the positive type resist pattern as a mask. Then, the positive type resist pattern is removed.

According to the present invention, sulfonic acid is generated at the exposed part of the resist. By the catalytic action of the proton of the sulfonic acid and the heat given, the hydroxyl group of the base resin and the cross linking agent react with each other at the exposed part, and the base resin is cross linked as a result. At the exposed part of the resist with the base resin cross linked, its glass transition point rises and its density also increases.

Therefore, at the time of a subsequent silylating processing, the resin at the exposed part is less likely to loosen even when the part is heated to the second temperature. As a result, the exposed part becomes less susceptible to the entrance of the silylating agent. Meanwhile at the non-exposed part, the base resin is not cross linked, and, therefore, the resin loosens when heated to the second temperature, thus allowing an easy entrance of silylating agent. A silylated layer is thus selectively formed on the surface of the non-exposed part.

The silylated layer changes into a $SiO_2$ layer at the time of development using oxygen plasma and the part immediately below the $SiO_2$ layer becomes less susceptible to dry etching. Meanwhile, at the exposed part, the resist is formed of only the material which evaporates by oxidation such as C, H, N and 0, and, therefore, the dry etching proceeds efficiently. A positive type resist pattern is thus provided.

According to the method, a resist pattern having a highly sensitive and good shape can be provided even with the use of light of a short wavelength or high energy beam such as electron beam and X ray.

Also, according to the present invention, the cross linking of the novolac resin in the resist proceeds in a chain reaction manner in the presence of acid generated at the time exposure as the catalyst. With the cross linking proceeding by the chain reaction, the amount of radiation used for exposure should not be large, which allows implementation of high sensitivity. Furthermore, with reduced amount of emittance, no undesirable side reactions take place in pattern formation. Consequently, excellent pattern formation can be implemented.

According to a method of manufacturing a photomask according to the present invention, a resist pattern is formed by the above-stated method, and a metal layer is etched using the resist pattern. A highly accurate photomask can be provided, because the accuracy of the resist pattern is high.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 9(a)-(g) are a sectional view showing a structure in the respective steps in the order of a method of manufacturing a photomask;

DESCRIPTION OF THE PREFERRED EMBODIMENTS

The preferred embodiments of the present invention will be described in conjunction with the drawings.

FIGS. 1(a)-(e) are partial sectional views showing a semiconductor device in the respective steps in the order of a manufacturing method in accordance with one embodiment of the present invention.

Figure 1A:
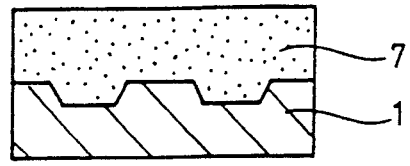
FIGS. 1(a)-(e) are a sectional view showing a semiconductor device in the respective steps in the order of manufacture in accordance with a method of forming a resist pattern in accordance with one embodiment of the present invention.
Figure 2A:
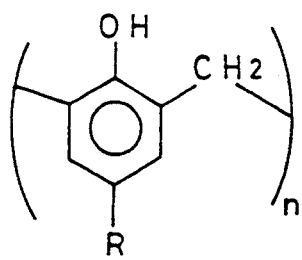
FIGS. 2(a)-(d) are a representation showing the chemical structures of base resin, cross linking agent and acid generating agent contained in a resist used in the present invention.
Figure 2B:
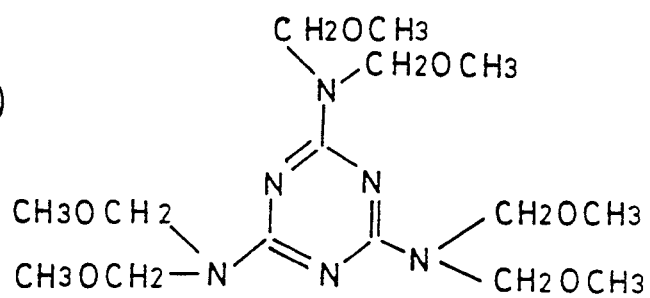
Figure 2C:
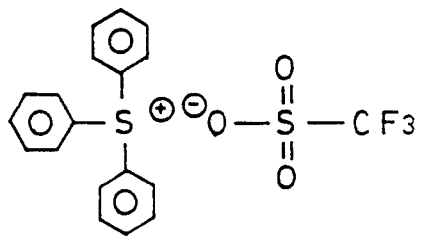

Referring to FIG. 1(a), resist 7 is applied on a substrate 1. Resist 7 contains base resin including a hydroxyl group, an acid generating agent which generates sulfonic acid upon irradiation, and a cross linking agent which reacts with the hydroxyl group of the base resin by the catalytic action of the proton of the sulfonic acid and thereby cross links base resins. More specifically, novolac resin shown in FIG. 2(a) is used for the base resin, hexamethylol-melamine-hexamethylether shown in FIG. 2(b) is used for the cross linking agent, and triphenyl sulfonium triflate shown in FIG. 2(c) is used for the acid generating agent. The weight ratio of the above-stated three components is base resin:cross linking agent:acid generating agent = 100:20:10. The ratio of mixing is preferably: cross linking agent 5-30 weight %, acid generating agent 3-15 weight % relative to base resin 100. The solution of resist is made by dissolving these three components into methyl cellosolve acetate 2. The solution of the resist is filtered and applied onto substrate 1 by means of spin coating. The substrate is then prebaked for one minute at a temperature of 85° C., thereby forming a uniform resist film 7 having a thickness of 1.2 μm on substrate 1. The thickness of resist film 7 is preferably in the range of 0.5 and 2 μm.

Figure 1B:
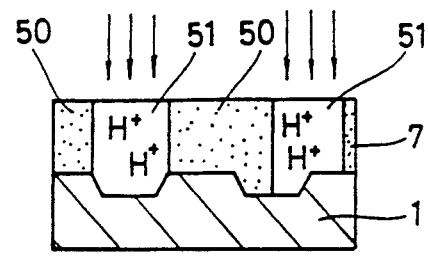
Figure 3:
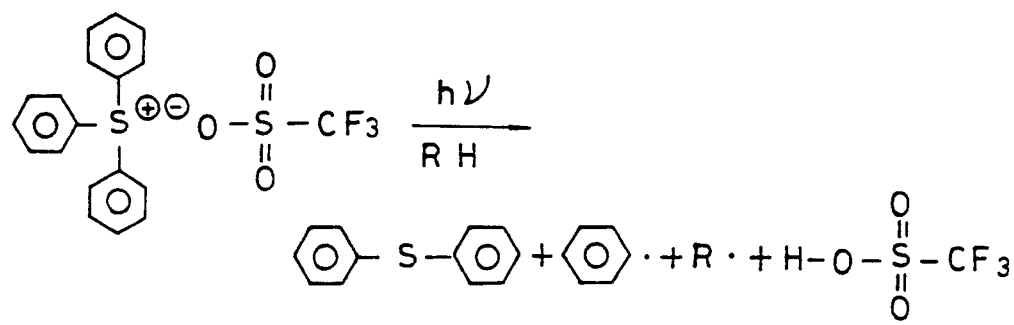
FIG. 3 is the reaction equation of the decomposition of triphenyl sulfonium triflate used in the present invention.

Referring to FIG. 1(b), electron beam of energy 20KeV is selectively emitted upon resist film 7 by exposure in the range between 1 and $10 \times 10^{-6}$C/cm$^2$, thereby dividing resist 7 into the exposed part 51 and the non exposed part 50. At the exposed part of resist film 7, triphenyl sulfonium triflate decomposes as in the reaction formula shown in FIG. 3 and trifluoromethane sulfonic acid which is a strong acid is generated.

Figure 1C:
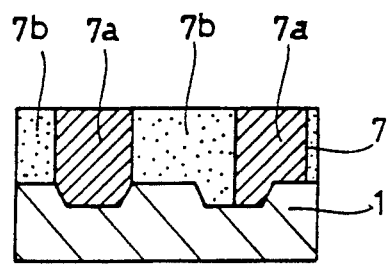
Figure 4:
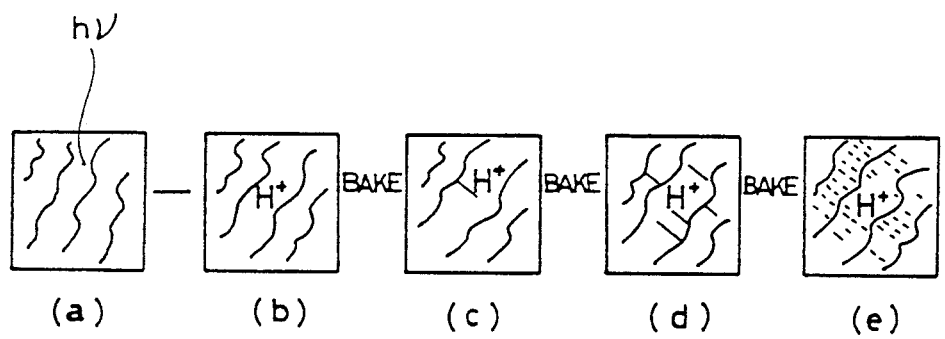
FIGS. 4(a)-(e) are a representation showing how the cross linking of base resin proceeds.

Referring to FIG. 1(c), baking after the exposure is conducted for two minutes at a temperature in the range between 50° and 150° C., preferably in the range between 100° and 130° C. A description will be provided on how cross linking goes at the exposed part of base resin 7 at the time of baking in conjunction with FIG. 4.

Figure 5:
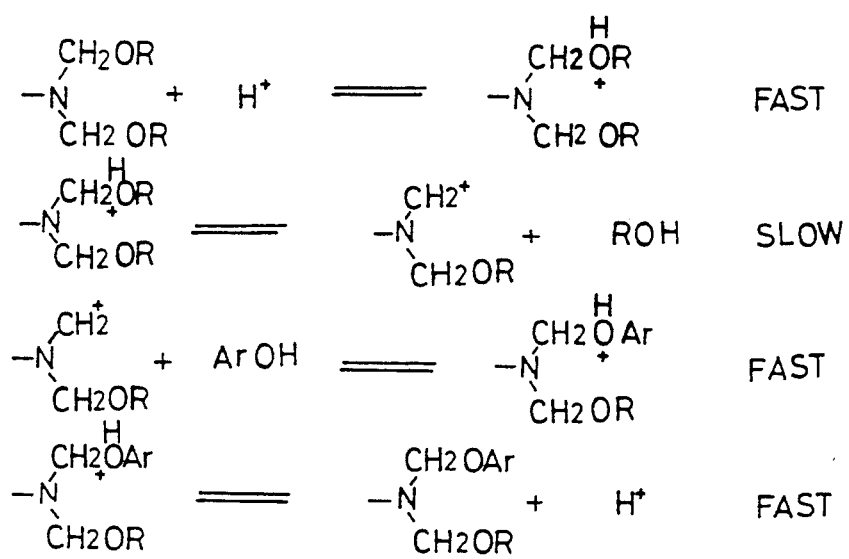
FIG. 5 is the reaction equation of the cross linking reaction of base resin.

FIG. 4(a) illustrates resist 7 irradiated with radiation. With resist 7 being irradiated with radiation, referring to FIG. 4(b), triphenyl sulfonium triflate decomposes and generates an acid (H+). Referring to FIG. 4(c), when the resist is baked, one of the base resins start cross linking in the presence of the acid (H+) as the catalyst and an acid (H+) is generated as a byproduct. Referring to FIG. 4(d), base resin cross links one after another in a chain reaction in the presence of the by-product acid (H+) as the catalyst. Referring to FIG. 4(e), base resins cross link and make a network structure due to the above-stated chain reaction. The chain reaction is represented by the reaction formula shown in FIG. 5.

Referring back to FIG. 1(c), the baking of resist 7 divides resist 7 into the cross linked part 7a and the non cross linked part 7b.

Figure 1D:
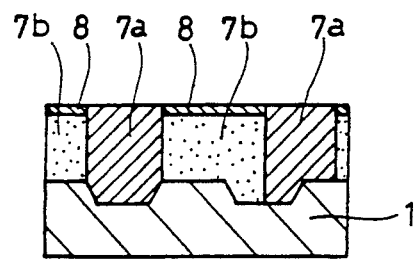
Figure 1E:
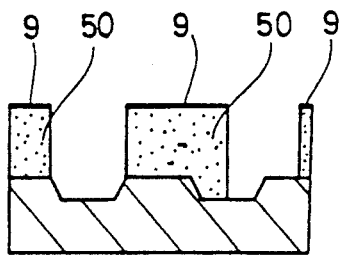

Referring to FIG. 1(d), a silylating layer 8 is formed on the surface of the non-cross linked part 7b of resist 7 by a silylating reaction.

The silylating reaction takes place as follows.

Figure 6:
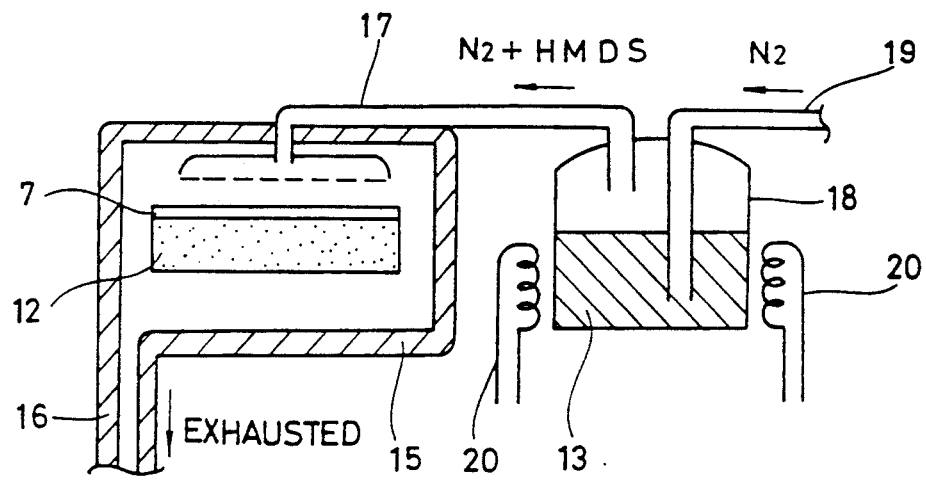
FIG. 6 is a representation showing the concept of a silylating device used in the present invention.

FIG. 6 is a view showing the concept of an apparatus used for silylating reaction. The silylating apparatus includes a vacuum chamber 15. Vacuum chamber 15 includes an outlet 16. Heating means 12 for heating substrate 7 is provided in vacuum chamber 15. One end of HMDS conduit 17 for guiding hexamethyldisilazane (HMDS) gas into vacuum chamber 15 is connected to the top of vacuum chamber 15. The other end of HMDS conduit 17 is connected to an HMDS tank 18 for storing HMDS liquid 13. Provided in HMDS tank 18 is a nitrogen gas conduit 19 for bubbling a nitride gas into the HMDS liquid stored in the tank. A heater 20 is for heating the HMDS liquid stored in HMDS tank 18.

A description of the operation follows.

Substrate 7 which was subjected to heat-treatment as shown in FIG. 1(c) is placed on heating means 12. Substrate 7 is heated by heating means 12 to a temperature identical to the temperature of baking after the exposure or lower, for example, a temperature in the range between 40° and 140° C., preferably between 100° and 130° C. Nitrogen gas is introduced into HMDS tank 18 via nitrogen gas conduit 19. Nitrogen gas is bubbled into the HMDS liquid 13. The bubbling of nitrogen gas allows the mixed gas of HMDS gas and nitrogen gas to be introduced into vacuum chamber 15 through HMDS conduit 17. The HMDS gas introduced into vacuum chamber 15 silylates the resist. This silylating reaction take place for 2-10 minutes.

Figure 7:
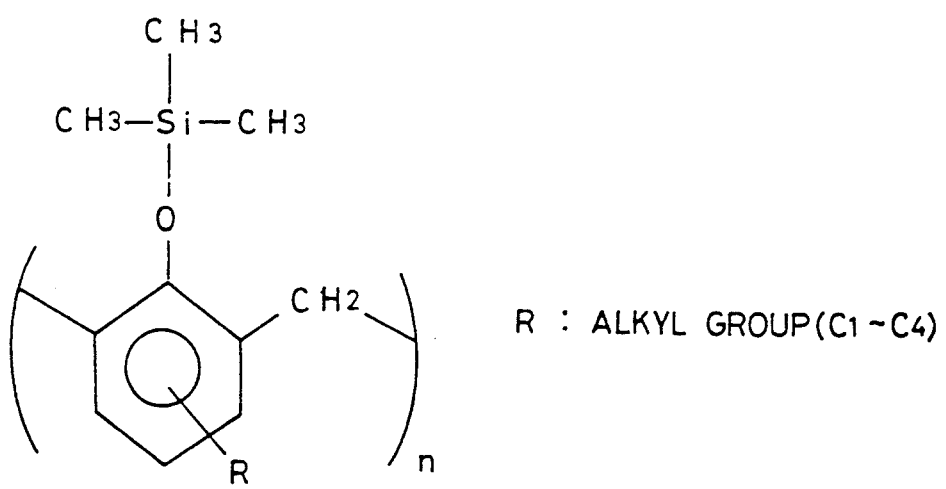
FIG. 7 is the chemical structural formula of the silylated resin.

The chemical structure of silylating layer 8 has a structure of the hydroxyl group of the phenol resin and HMDS bound as shown in FIG. 7.

Silylated layer 8 is selectively formed only at the non-cross linked part 7b for the following reason.

More specifically, the glass transition temperature of the resin is raised by the cross linking at the cross linked part 7a. The resin therefore does not loosen at the cross linked part 7a even when resist 7 is heated to a temperature in the range between 100° and 130° C. as described above. As the resin does not loosen the HMDS can not permeate therein.

Meanwhile at the non-cross linked part 7b, with no cross linking taking place, the resin loosens when heated to a temperature in the range between 100° and 130° C., facilitating the HMDS to enter. Therefore, silylating layer 8 is formed only at the non-cross linked part 7b.

Referring to FIGS. 1(d) and (e), dry development is conducted using O$_2$ plasma. Silylated layer 8 then turns into an SiO$_2$ layer 9 and functions as a mask for the part immediately below SiO$_2$ layer 9, in other words a non-exposed part 50, thereby preventing the non-exposed part 50 from being etched. Meanwhile the exposed part 50 (cross linked part 7a) is etched away by O$_2$ plasma, and a positive type resist pattern is formed.

A parallel plate type reactive ion etching apparatus or a magnetron etching apparatus can both be used for the dry development apparatus. O$_2$ gas is supplied under the condition of a flow amount of 70 SCCM and a vacuum degree of 4mTorr.

Figure 8:
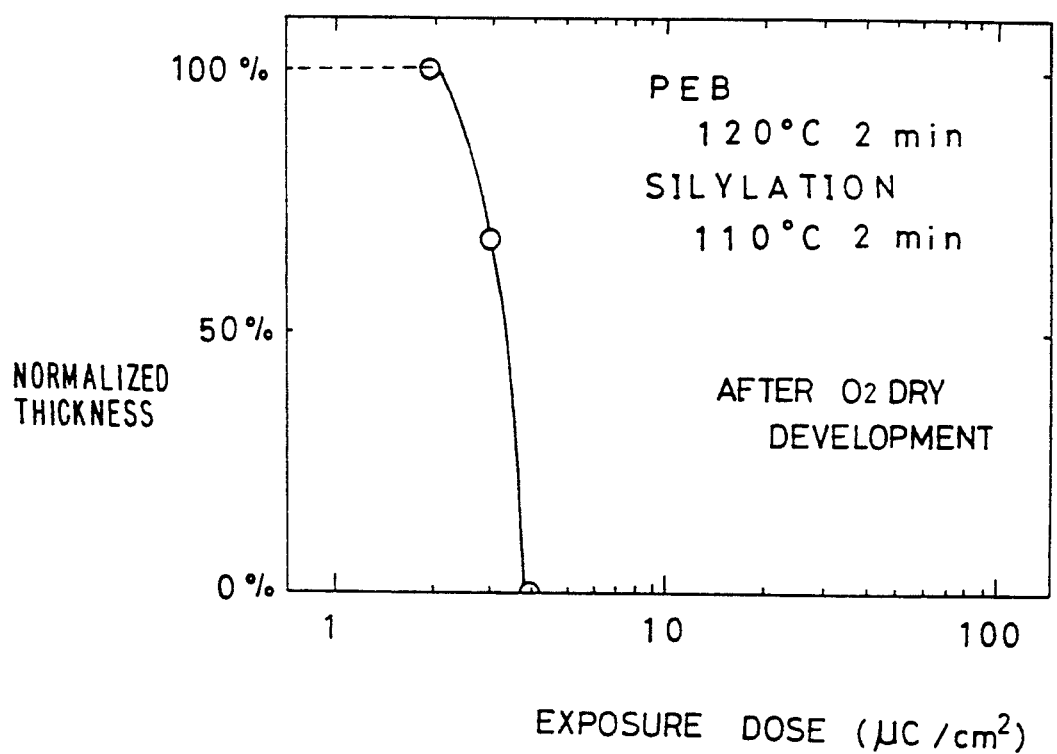
FIG. 8 is a representation showing the relation between the exposure dose and normalized film thickness.

FIG. 8 is a graphic representation showing the sensitivity of a method of forming a resist pattern in accordance with the present embodiment by way of quantification.

The abscissa represents the exposure of radiation which is emitted in the step shown in FIG. 1(b). The ordinate represents the remained normalized film thickness of the resist at the exposed part in the dry development step shown in FIG. 1(e). When the exposed part is completely removed after the dry development, the film remaining rate becomes zero.

Referring to FIG. 8, the exposure amount at the point where the film thickness after development becomes zero is 4 μC/cm$^2$. This value is about one tenth - one hundredth that of polymethyl methacrylate which is conventionally known typical positive type resist. More specifically, in the present embodiment, the sensitivity is 10-100 times higher than conventional polymethyl methacrylate resist.

According to the present embodiment, with an exposure dose of 6 μC/cm$^2$, it is possible to form a resist pattern having lines and spaces equal to or smaller than 1 μm.

FIG. 9 illustrates a flow of manufacturing a photomask in which the above-stated method of forming a resist pattern is applied.

Figure 9A:
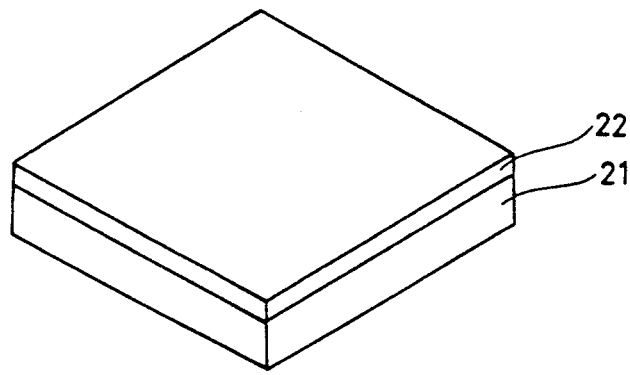

Referring to FIG. 9(a), a metal layer 22 formed of materials such as Cr and MoSi is formed on quartz glass 21.

Figure 9B:
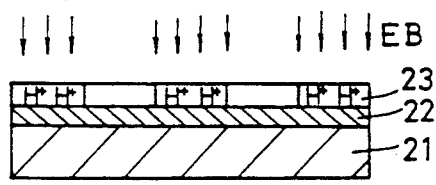

Referring to FIG. 9(b), resist for electron beam 23 which contains base resin including a hydroxyl group, triphenyl sulfonium triflate, and hexamethylol-melamine-hexamethylether is applied onto metal layer 22.

Then, electron bean is selectively irradiated upon resist 23, whereby resist 23 is divided into the exposed part and the non-exposed part, and sulfonic acid is generated in resist 23 at the exposed part.

Figure 9E:
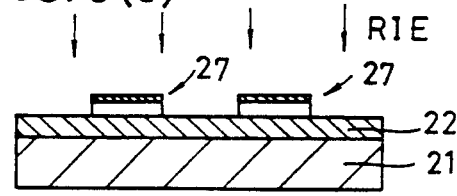
Figure 9C:
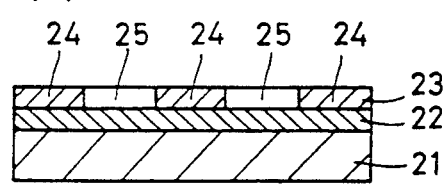
Figure 9F:
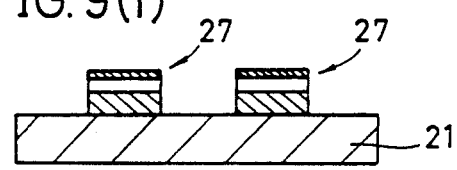

Referring to FIG. 9(c), resist 23 is baked to a temperature in the range between 50° and 150° C. This baking allows the exposed part of resist 23 to cross link, separating the cross linked part 24 and non-cross linked part 25.

Figure 9D:
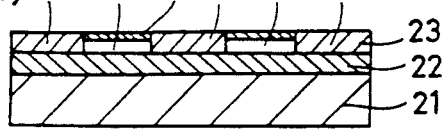
Figure 9D:
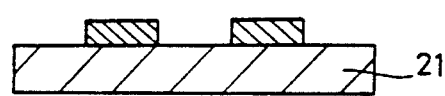
Figure 9D:
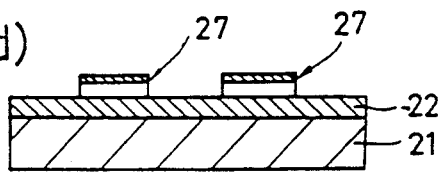
Figure 10A:
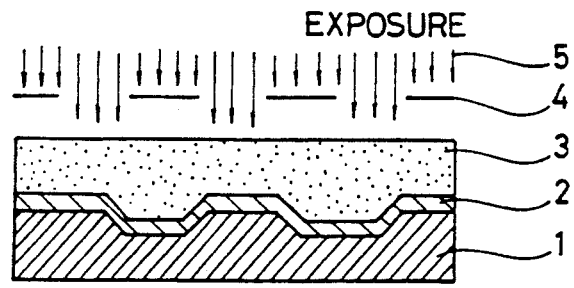
FIGS. 10(a)-(e) are a sectional view showing a semiconductor device in the respective steps in the order of a conventional DESIRE process.
Figure 10B:
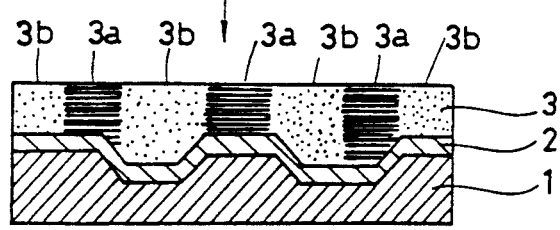
Figure 10C:
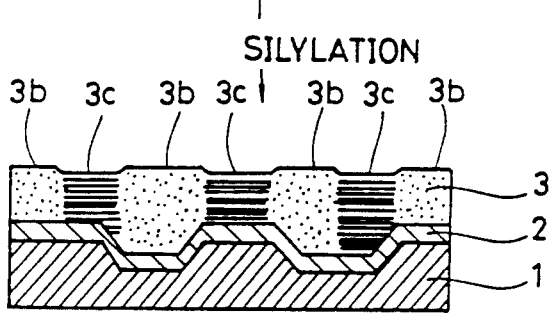
Figure 10D:
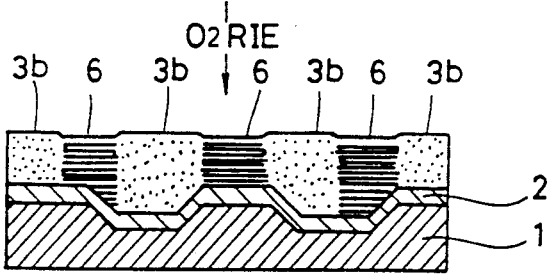
Figure 10E:
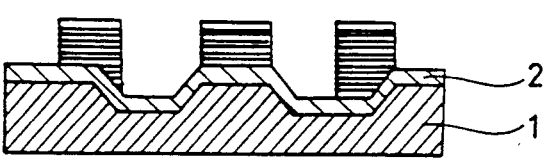
Figure 11A:
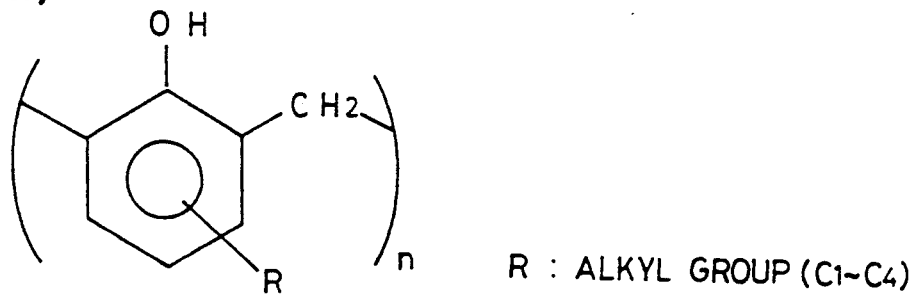
FIGS. 11(a)-(b) are the chemical structural formula of resin and photosensitive agent used in a conventional DESIRE process.
Figure 11B:
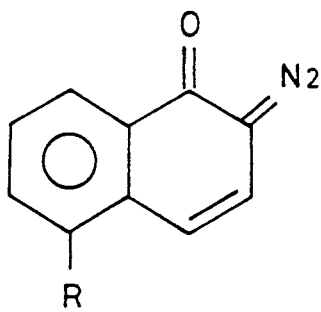
Figure 12:
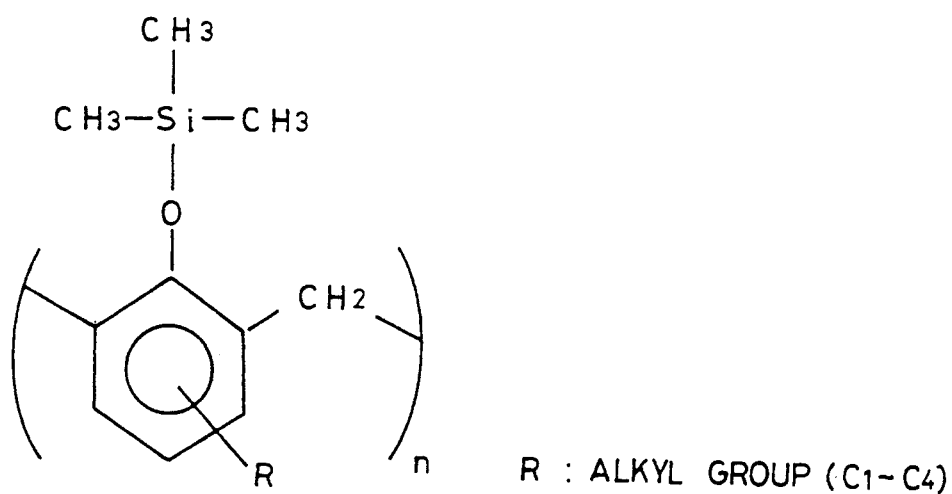
FIG. 12 is the chemical structural formula of the compound of novolac resin and silylating agent obtained in a conventional DESIRE process.
Figure 13:
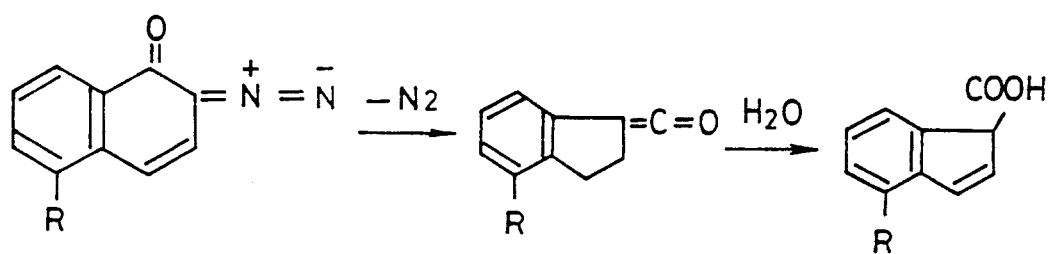
FIG. 13 is a representation showing the decomposition of naphthoquinodiazide in a conventional DESIRE process by way of the chemical reaction equation.

Referring to FIG. 9(d), resist 23 is exposed in an atmosphere of HMDS at a temperature in the range between 40° and 140° C., and the surface of the non-cross linked part 25 of resist 23 is thus selectively silylated, forming a silylated layer 26.

Referring to FIG. 9(d), by dry developing resist 23 by oxygen plasma, a positive type resist pattern 27 exclusive of the cross linked part 24 is formed.

Referring to FIGS. 9(e) and (f), using positive type resist pattern 27 as a mask, metal layer 22 is selectively etched by means of reactive ion etching.

Referring to FIG. 9(g), then after the removal of the positive resist pattern, a photomask with a desired image formed thereon is provided.

According to the method of manufacturing a photomask, referring to FIG. 9(d), metal layer 22 is etched extremely accurately, because the accuracy of resist pattern 27 is high. As a result, a highly precise photomask can be provided.

Figure 2D:
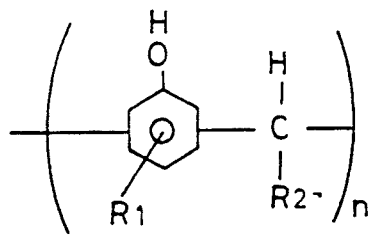

Although in the above-stated embodiment, the resin shown in FIG. 2(a) is used for the novolac resin, a resin having the general formula shown in FIG. 2(d) may be used. Resin can be preferably used such as m-cresol • p-cresol • formaldehyde • novolac resin, phenol • m-cresol • formaldehyde • novolac resin, and m-cresol • formaldehyde • novolac resin.

Also, although in the above-described embodiment, the case in which hexamethyldisilazane is used for the silylating agent has been described, the present invention is not limited thereto, and similar effects to the embodiment can be provided by the use of 1, 3 -dichrolotetramethyldisiloxane, 1, 1, 3, 3, 5, 5 -hexamethyl-cyclotrisilazane, 1, 1, 3, 3 -tetramethyldisilazane, and 2, 2, 5, 5 -tetramethyl - 2, 5 - disila - 1 - azacyclopentanone.

In the above-described embodiment, the case in which an electron beam of energy 1–100 keV is used has been described as an example, but the present invention is by no means limited thereto, and a beam such as light of a wavelength not more than 250 mm, mercury lamp g ray of a wavelength 436 nm, mercury lamp i ray of a wavelength 365 nm, KrF eximer laser of a wavelength 248 nm, ArF eximer laser of a wavelength 193 nm, ion beam of energy in the range between 5 and 500 keV, and X ray of a wavelength in the range between 4 and 20 nm can preferably be used.

As in the foregoing, according to the present invention, cross linking of novolac resins in the resist proceeds in a chain reaction manner in the presence of acid generated at the time of exposure as the catalyst. As the cross linking proceeds by the chain reaction, the exposure dose is reduced, and high sensitivity can be provided as a result. Also due to the reduced exposure dose, no undesired side reactions are produced in the formation of patterns. Consequently, excellent pattern formation can be provided.

According to the method of manufacturing photomasks according to the present invention, an image is formed using a resist having a good pattern as described above, a highly accurate photomask can efficiently be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming a resist pattern, comprising the steps of:
    applying onto a substrate a resist containing a base resin including a hydroxyl group, an acid generating agent for generating a sulfonic acid when irradiated with radiation, and a cross linking agent for reacting with the hydroxyl group of the base resin by the catalytic action of the proton of the sulfonic acid to thereby cross link said base resin;
    selectively irradiating the resist with radiation, thereby dividing the resist into an exposed part and a non-exposed part and generating the sulfonic acid in the resist at the exposed part;
    heating the resist to a first temperature so as to cause the hydroxyl group of the base resin to react with the cross linking agent by the catalytic action of the proton of the sulfonic acid, thereby cross linking the exposed part of the resist;
    prior to dry developing the resist, selectively silylating the surface of the non-exposed part of the resist by heating the resist to a second temperature and exposing the resist in an atmosphere of a silylating agent; and
    dry-developing the resist with oxygen plasma to remove the exposed part of the resist and simultaneously convert a silylated layer formed on the surface of the non-exposed part of the resist to silicon dioxide, thereby forming a positive type resist pattern.

2. A method as recited in claim 1, wherein said acid generating agent includes triphenyl sulfonium triflate.

3. A method as recited in claim 1, wherein said cross linking agent includes a melamine derivative.

4. A method as recited in claim 3, wherein said melamine derivative includes hexamethylol-melamine-hexamethylether.

5. A method as recited in claim 1, wherein the film thickness of said resist is in the range between 0.5 and 2 μm.

6. A method as recited in claim 1, wherein said cross linking agent is added in an amount of 5–30 weight % based on said base resin, and said acid generating agent is added in an amount of 3–15 weight % based on said base resin.

7. A method as recited in claim 1, wherein said second temperature is lower than said first temperature.

8. A method as recited in claim 1, wherein said first temperature is in the range between 50° and 150° C.

9. A method as recited in claim 1, wherein
    said second temperature is in the range between 40° and 140° C.

10. A method as recited in claim 1, wherein said base resin includes novolac resin.

11. A method as recited in claim 1, wherein
    said radiation includes an electron beam of energy in the range between 1 and 100 keV.

12. A method as recited in claim 1, wherein said silylating agent includes 1, 1, 3, 3-tetramethyldisilazane.

13. A method of manufacturing a photomask, comprising the steps of:
    forming a metal layer on a glass substrate;

applying onto the metal layer a resist containing a base resin including a hydroxyl group, an acid generating agent for generating a sulfonic acid when irradiated with radiation, and a cross linking agent for reacting with the hydroxyl group of the base resin by the catalytic action of the proton of the sulfonic acid to thereby cross link the base resin;

selectively irradiating the resist with radiation, thereby dividing the resist into an exposed part and a non-exposed part and generating the sulfonic acid in the resist at the exposed part;

heating the resist to a first temperature so as to cross link the exposed part of the resist by causing the reaction of the hydroxyl group of the base resin and the cross linking agent in the presence of the proton of the sulfonic acid as the catalyst;

prior to dry developing the resist, selectively silylating the surface of the non-exposed part of the resist by heating the resist to a second temperature and exposing the resist in an atmosphere of a silylating agent;

dry-developing said resist with oxygen plasma to remove the exposed part of the resist and simultaneously convert a silylated layer formed on the surface of the non-exposed part of the resist to silicon dioxide, thereby forming a positive type resist pattern;

selectively etching the metal layer using the positive type resist pattern as a mask; and removing the positive type resist pattern.

14. A method as recited in claim 13, wherein said radiation includes an electron beam.

15. A method as recited in claim 13, wherein said acid generating agent includes triphenyl sulfonium triflate.

16. A method as recited in claim 13, wherein said cross linking agent includes a melamine derivative.

17. A method as recited in claim 16, wherein said melamine derivative includes hexamethylol-melamine-hexamethylether.

18. A method as recited in claim 13, wherein said first temperature is in the range between 50° and 150° C.

19. A method as recited in claim 13, wherein said second temperature is in the range between 40° and 140° C.

* * * * *